United States Patent
Ganea (10) Patent No.: US 7,751,483 B1
(45) Date of Patent: Jul. 6, 2010

(54) VIDEO CODEC FOR EMBEDDED HANDHELD DEVICES

(75) Inventor: Alexandre Ganea, Montreal (CA)

(73) Assignee: Majesco Entertainment Company, Edison, NJ (US)

( * ) Notice: Subject to any disclaimer, the term of this patent is extended or adjusted under 35 U.S.C. 154(b) by 1464 days.

(21) Appl. No.: 11/103,898

(22) Filed: Apr. 12, 2005

Related U.S. Application Data (60) Provisional application No. 60/562,934, filed on Apr. 16, 2004, provisional application No. 60/562,960, filed on Apr. 16, 2004.

(51) Int. Cl.
*H04N 7/12* (2006.01)
*G06K 9/00* (2006.01)

(52) U.S. Cl. .................. 375/240.22; 382/253

(58) Field of Classification Search ........... 348/417, 348/422, 418, 402, 700, 405, 409, 404, 411, 348/420, 416, 699, 413, 398, 384, 385, 415, 348/390; 382/238, 239, 240, 243, 253, 159, 382/160, 168, 170, 171, 172, 173, 175, 176, 382/180, 181, 190, 192, 195, 203, 209, 224, 382/235, 244, 248, 251, 252, 282, 286, 307, 382/308, 233, 234, 250, 274, 275, 232, 236; 375/240, 241, 240.22, 240.23, 240.12, 240.25, 375/240.24, 240.17
See application file for complete search history.

(56) References Cited

U.S. PATENT DOCUMENTS

| | | | | |
|---|---|---|---|---|
| 4,853,778 A | 8/1989 | Tanaka | ................ | 358/133 |
| 4,862,261 A | 8/1989 | Tanaka | ................ | 358/133 |
| 5,227,863 A | 7/1993 | Bibrey et al. | ................ | 348/578 |
| 5,432,893 A | 7/1995 | Blasubramanian et al. | .. | 345/600 |
| 5,745,872 A | 4/1998 | Sonmez et al. | ................ | 704/222 |
| 5,757,306 A * | 5/1998 | Nomura | ................ | 341/200 |
| 5,822,465 A * | 10/1998 | Normile et al. | ................ | 382/253 |
| 5,974,387 A * | 10/1999 | Kageyama et al. | ................ | 704/500 |
| 6,326,977 B1 | 12/2001 | Westerman | ................ | 345/591 |
| 6,628,718 B1 * | 9/2003 | Niwamoto | ................ | 375/240.23 |
| 7,239,635 B2 * | 7/2007 | Ozguner | ................ | 370/392 |
| 2002/0048389 A1 * | 4/2002 | Komaki | ................ | 382/107 |
| 2005/0025361 A1 * | 2/2005 | Gadre et al. | ................ | 382/181 |

OTHER PUBLICATIONS

An office action for related U.S. Appl. No. 11/103,667 mailed Nov. 29, 2007.

P. Deutsch, "DEFLATE Compressed Data Format Specification version 1.3," Network Working Group, Request for Comments: 1951, Aladdin Enterprises, May 1996.

(Continued)

*Primary Examiner*—Behrooz Senfi
(74) *Attorney, Agent, or Firm*—Dov Rosenfeld; Inventek (57) ABSTRACT

A video codec that allows for improved performance of embedded devices using vector quantization and the high correlation between frames in a scene to reduce the overhead associated with displaying video data. Video coding includes determining scene changes in a movie, producing one codebook for each scene, and coding each frame within a scene with the same codebook. The quantized video data is then losslessly compressed and formed into a video stream. Video decoding includes decoding the codebook for a frame and supplying the codebook and frame indices for frame rendering. Alternatively, video coding also includes dividing CPU time between codebook processing, indices processing, and frame rendering to ensure smooth video output.

17 Claims, 8 Drawing Sheets

OTHER PUBLICATIONS

"Vector Quantization" Tutorial, Downloaded Jun. 28, 2005 from Data-Compression.com. Available online at http://www.data-compression.com/vq.shtml.

"Introduction to Motion Estimation and Compensation," DSP Group of Communication and Multimedia Laboratory, downloaded Jun. 28, 2005. Available online at http://www.cmlab.csie.ntu.edu.tw/cml/dsp/training.coding.motion/mel.html.

A final office action for U.S. Appl. No. 11/103,667 mailed on Aug. 14, 2008.

* cited by examiner

VIDEO CODEC FOR EMBEDDED HANDHELD DEVICES

CROSS-REFERENCE TO RELATED APPLICATIONS

This application claims the benefit of U.S. Provisional Application No. 60/562,934, filed Apr. 16, 2004, the contents of which are incorporated herein by reference.

This application also claims the benefit of U.S. Provisional Application No. 60/562,960, filed Apr. 16, 2004, the contents of which are incorporated herein by reference.

BACKGROUND OF THE INVENTION

The present invention generally relates to a codec for digital data, and more particularly to a method and system for digitally decompressing video data on embedded devices.

Over the years, portable (or hand-held) game machines have been, and continue to be, very popular. Typically, these portable game machines include a hand-held game machine housing a display for displaying images and a game processing unit, and associated hardware for running a game program. The game program itself is typically contained in a game program memory such as, for example, a semiconductor memory (e.g., ROM, EPROM, etc.) that is part of a removable cartridge. By storing the game program in a removable cartridge, the user can conveniently and easily change the game being played by simply exchanging one cartridge with another, different cartridge containing a different game. Examples of portable game machines are the "Game Boy®" and "Game Boy® Color" products manufactured and sold by Nintendo of America Inc.

Generally, the functionality of conventional portable game machines of the type described above is directed to executing, on the hand-held processing unit, the game that is provided to the game program memory from a particular removable cartridge in response to user input. When using the portable game machine, visual and auditory feedback is provided to the user. The visual and auditory content is stored in compressed form in the removable cartridge along with programming information to instruct the processor for decompressing the content. The visual content is provided to the user on a color or monochrome display, such as a liquid crystal display (LCD), and the auditory content is provided via a speaker that is part of the hand-held unit or via a headphone jack.

Figure 1A:
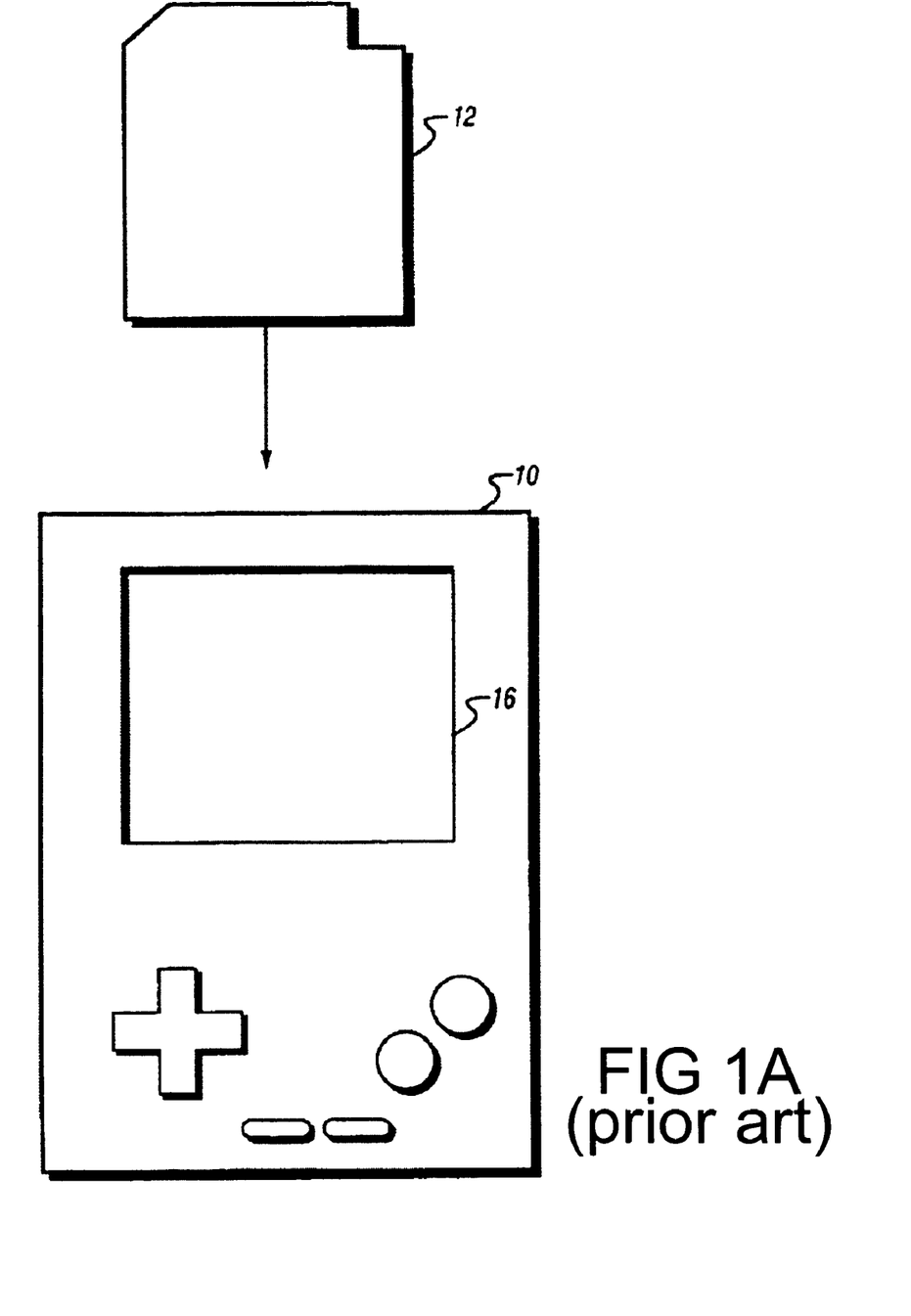
FIGS. 1A-1C show aspects of a prior art portable (hand-held) game machine.
Figure 1B:
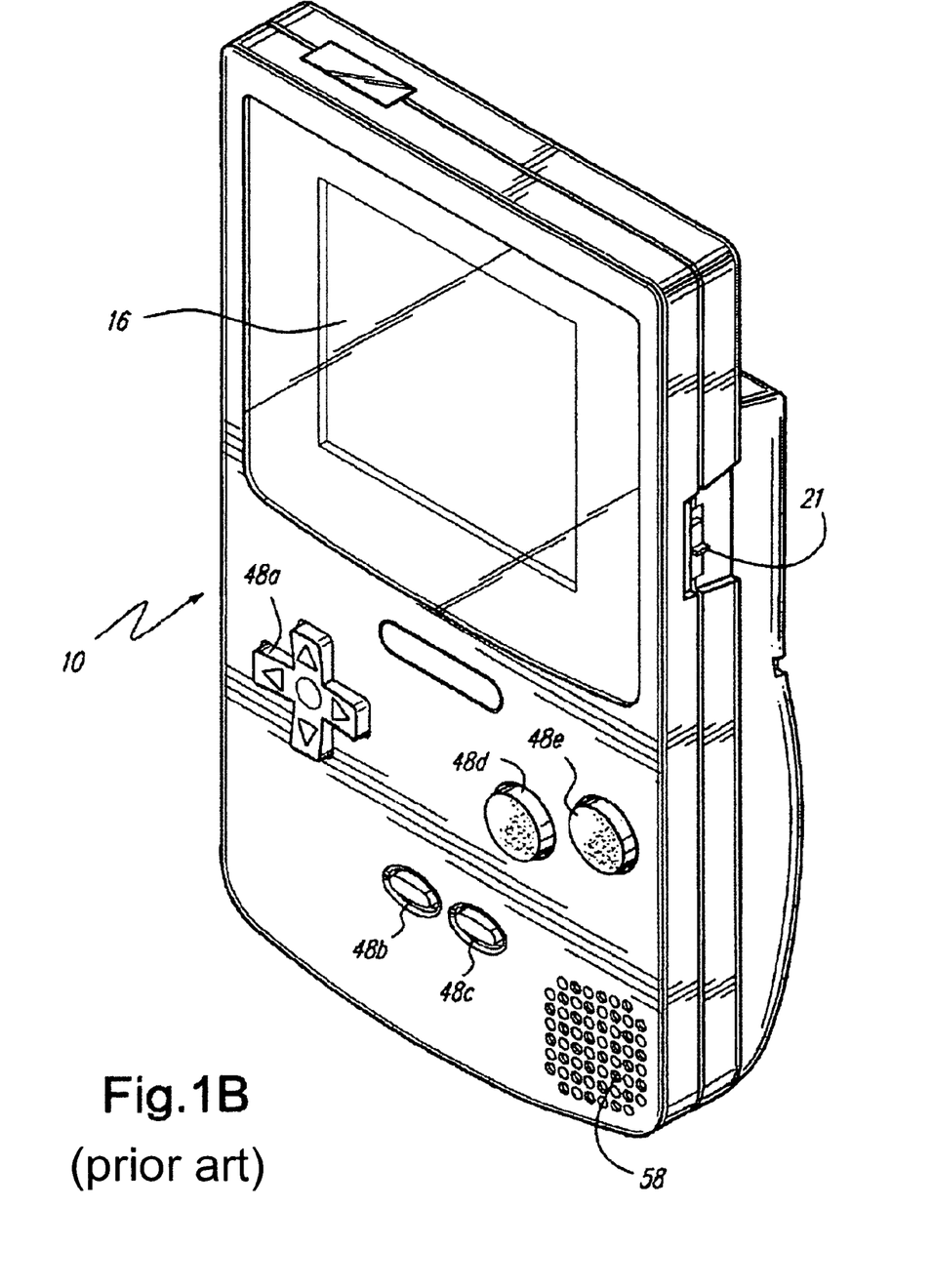
Figure 1C:
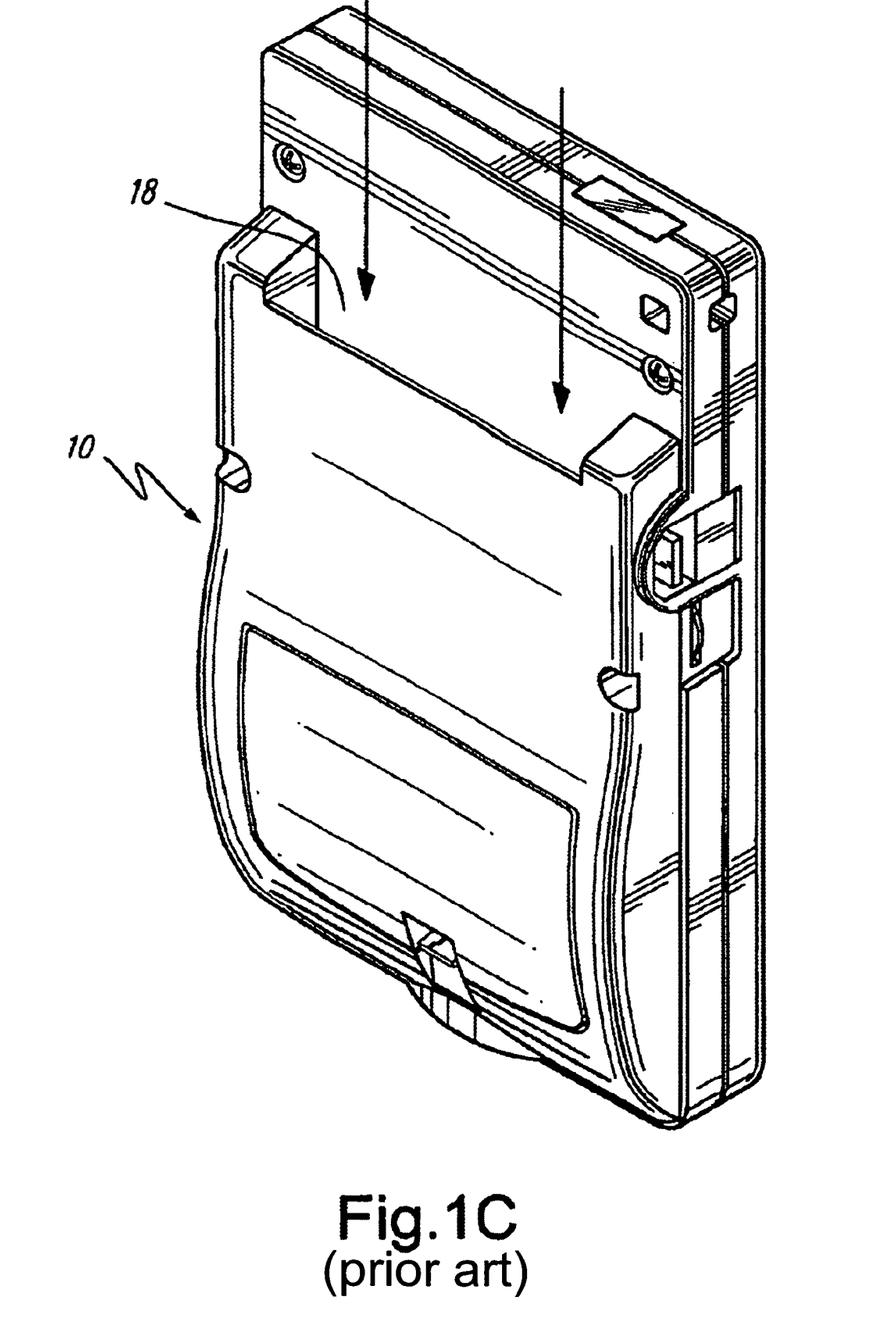
Figure 2:
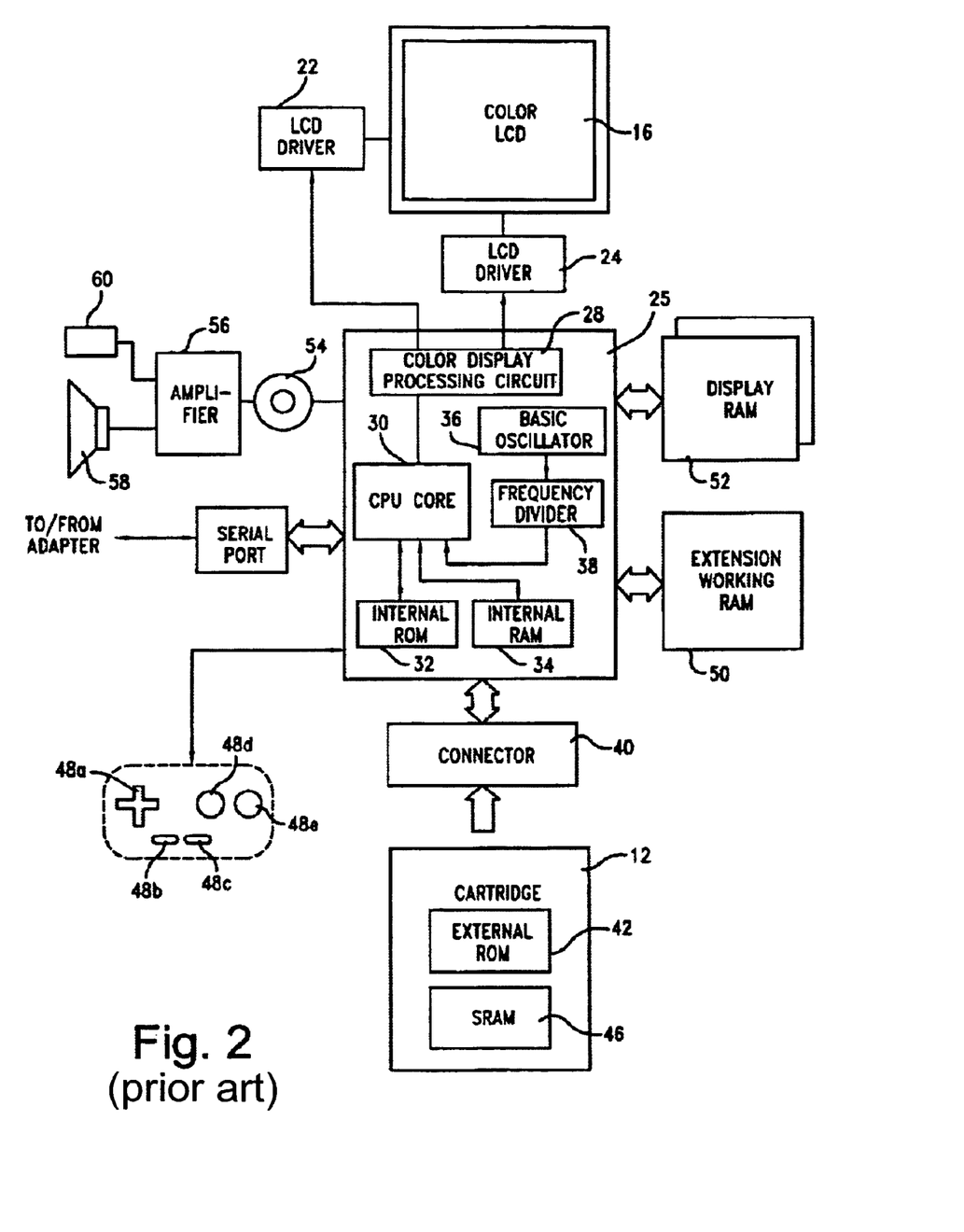
FIG. 2 shows a overall block diagram of the prior art game cartridge and the game machine shown in FIGS. 1A-1C.

A prior art embedded device is illustrated in FIGS. 1A, 1B, and 1C, which show a portable (hand-held) color display game machine (hereinafter, referred to simply as "game machine") 10 that displays game characters in color on a color liquid crystal display (LCD) 16 when a prior art color-ready game cartridge 12 is selectively inserted into a slot 18, and in FIG. 2 as an overall block diagram of the game machine and game cartridge. Batteries (not shown), e.g., 2 AA batteries provide power for game machine 10, which may also be configured for connection to an AC adapter to permit extended use without batteries. Game machine 10 is a prior art game machine and is described, for example, in U.S. Pat. No. 6,716,103, incorporated herein by reference.

The color LCD 16 displays either color or black and white depending on the type of game cartridge 12 inserted into the game machine 10. With reference to FIG. 2, prior art game machine 10 includes color LCD 16 as described above, and is formed as a dot matrix display and is driven by LCD drivers 22 and 24 to display color images on its screen. LCD driver 22 selectively drives, for example, the rows of the dot matrix display and LCD driver 24 selectively drives, for example, the columns of the dot matrix display. LCD drivers 22, 24 are supplied with color image signals from a color display processing circuit 28 included in a central processing unit (CPU) 25.

CPU 25 further includes a CPU core 30 that is connected to an internal read only memory (ROM) 32 and an internal random access memory (RAM) 34. Internal RAM 34 is used as a work memory of CPU core 30. CPU 25 further includes a basic oscillator 36, for example, a quartz oscillator that supplies an oscillating signal to a programmable frequency divider 38. Programmable frequency divider 38 divides the oscillating signal from basic oscillator 36 in accordance with frequency division data from CPU core 30, and supplies a divided signal as a clock of CPU core 30.

Programs for operating game machine 10 are provided through a connector 40 connected to CPU 25 by an appropriate bus. More specifically, game cartridge 12 shown in FIG. 1A is selectively attachable to connector 40. Game cartridge 12 is preferably in the form of a replaceable memory cartridge that can be inserted into slot 18 of game machine 10 and having a printed circuit board with a connector defining a number of electrical contacts. When game cartridge 12 is inserted into slot 18 of game machine 10, the cartridge electrical contacts mate with corresponding "edge connector" electrical contacts within game machine 10. This action electrically connects the printed circuit board to the electronics within game machine 10. In this example, the printed circuit board of game cartridge 12 at least includes a read-only memory (ROM) 42 and a read/write memory (e.g., SRAM) 46. ROM 42 stores instructions and other information pertaining to a particular video game. ROM 42 for one game cartridge 12 may, for example, contain instructions and other information for an adventure game while the ROM of another game cartridge 12 may contain instructions and other information for a car race game or an educational game, for example. To play a game, a user of game machine 10 need only plug the appropriate game cartridge into slot 18 of game machine 10 thereby connecting the cartridge's ROM 42 (and other any circuitry it may contain) to game machine 10. This enables the game machine circuitry to access information contained within ROM 42 (and read/write memory 46), which information controls the game machine to play the appropriate video game by displaying images and reproducing sound as specified under control of the ROM game program information. Read/write memory 46 is used to store data such as game backup data.

In accordance with the game program, character data supplied from game cartridge 12 and the controller data from operating keys 48a-48e, CPU 25 executes data processing and writes display data into a display RAM 52, using an extended RAM 50 when necessary. As a result of the data processing by CPU 25, pixels of color LCD 16 are controlled and sound signals to be output are adjusted in level by volume controls 54 and 56, and then outputted to a speaker 58 and/or an earphone jack 60. Color LCD 16 displays still or moving images, and sound signals output from speaker 58 and/or earphone jack 60 include game sound effects, voices and music.

Generally speaking, to use game machine 10 to play a game, a user selects a game cartridge 12 containing a desired video game, and inserts that game cartridge into slot 18 of game machine 10, thereby electrically connecting ROM 42 and other cartridge electronics to game machine 10. The user then operates a power switch 21 (see FIG. 1B) to turn on game machine 10 and operates operating keys 48a-48e to control video game play.

The gaming experience depends on the quality of the content provided to the user, where the quality includes the resolution of the display (both in pixel and color resolution), the tonal quality of the sound output, and how rapidly the output can change in response to the user's input. The memory and computational limitations of embedded devices, such as game machine 10, require that audio and video data be stored in the removable memory unit, such as game cartridge 12, in compressed format which must be decompressed prior to being displayed.

The ability of embedded devices to play back compressed audio and video data is limited by the memory and processing power of game machine 10, the amount of memory in game cartridge 12, and the speed at which the game machine 10 can read information from the game cartridge. It is common to provide more content by compressing audio and video data through "lossy" methods that rely on the fact that not all of a sound or visual content is perceived by a person due to perception limitations of people, and that not all displays or sound systems can respond to very high or very low frequencies. Thus, for example, the human eye is not necessarily able to detect slight variations in position or color on a display. In addition, displays may not be able to present all of the information in the original content, and thus the storage and transmission of that information is a poor use of limited storage or bandwidth resources. It is thus possible to store sound using lossy compression methods that is where the process of compressing and then reconstructing an image results in the loss of some information. Many prior art lossy compression codecs, such as the MPEG-4 video codec, achieve good compression ratios, but require a rather advanced level of signal processing that is not available on systems having limited resources.

While the prior art use of codecs may be effective in some environments, the required memory and processor speed is not within the capabilities of most embedded devices, such as cell phones, personal digital assistants, and portable games machines. Thus there is a need in the art for a method and apparatus that result in compression at least as good as prior art codecs. In addition, it is preferable that the apparatus is compatible with existing hardware, and that it contains an implementation of the inventive method for improving the performance of prior art units that can accept programming cartridges.

BRIEF SUMMARY OF THE INVENTION

Aspects of the present invention include providing a compressed image that is encoded using vector quantization (VQ) applied to image sequences. Aspects of the present invention also include controlling the processing CPU time to share computing capacity between frames among codebook processing, indices processing, and frame rendering.

One aspect of the present invention is a video codec and a video codec method that encodes video data by detecting scene changes in a sequence of frames, determining a codebook for use for all of the frames in each scene, and forming a stream including the codebook for the scene and the indices for each frame in the scene. In one embodiment of the present invention the codebook and indices are compressed with a lossless compression method.

Another aspect of the present invention is a video codec and a video codec method that decodes video data by providing a codebook used by a sequence of frames in a scene and the indices of each frame in a scene for rendering.

Another aspect of the present invention is a video codec and a video codec method that decodes video data using VQ by dividing available processing time among codebook processing, indices processing, and frame rendering.

Another aspect of the present invention is a carrier medium containing a video codec program that decodes video data by providing a codebook used by a sequence of frames in a scene and the indices of each frame in a scene for rendering.

Another aspect of the present invention is a carrier medium containing a video codec program that decodes video data using VQ by dividing available processing time among codebook processing, indices processing, and frame rendering.

Another aspect of the present invention is a method for compressing a movie having scenes and scene changes between the scenes. The method includes determining scene changes, vector quantizing all of the frames between two sequential scene changes to provide indices and a corresponding codebook to display the scene, applying a predictor to the codebook; and losslessly compressing said predictor applied codebook and indices.

Another aspect of the present invention is a method for decompressing a movie having scenes and scene changes between the scenes. The method includes fetching a block of data, performing an inverse entropy decompression on the fetched block to produce indices and a codebook for a scene, reconstructing the codebook, decoding the codebook; and applying the indices and the decoded codebook to render the scene.

Another aspect of the present invention is a carrier medium carrying one or more computer readable code segments to instruct a processor to implement a method for decompressing a movie. The method includes fetching a block of data, performing an inverse entropy decompression on the fetched block to produce indices and a codebook for a scene, reconstructing the codebook, decoding the codebook, and applying the indices and decoded codebook to render the scene.

One aspect of the present invention is a method decompressing data representative of a movie having frames forming scenes and having scene changes between said scenes. The decompressed data includes a first sequence of indices and a corresponding first codebook for rendering frames of a first scene, followed by a second sequence of indices a corresponding second codebook for rendering frames of a second scene following said first scene. The method includes allocating processing between the rendering of sequential frames, where the allocating includes allocating of processing time for prefetching indices for use with the first codebook, and then allocating of processing time for prefetching said second codebook, and further including caching prefetched indices and codebooks.

Yet another aspect of the present invention is a carrier medium carrying one or more computer readable code segments to instruct a processor to implement a method for decompressing data representative of a movie having frames forming scenes and having scene changes between the scenes. The decompressed data includes a first sequence of indices and a corresponding first codebook for rendering frames of a first scene, followed by a second sequence of indices a corresponding second codebook for rendering frames of a second scene following said first scene. The method includes allocating processing between the rendering of sequential frames, where said allocating includes allocating of processing time for prefetching indices for use with the first codebook, and then allocating of processing time for prefetching said second codebook, and further including caching prefetched indices and codebooks.

It is another aspect of the present invention to provide a video codec that is easily implemented on existing embedded devices.

These features together with the various ancillary provisions and features which will become apparent to those skilled in the art from the detailed description, are attained by the device of the present invention, preferred embodiments thereof being shown with reference to the accompanying drawings, by way of example only, wherein:

BRIEF DESCRIPTION OF THE DRAWING

FIG. 3A shows an embodiment of a game cartridge that, for example, includes a program embodiment of the present invention. FIG. 3A also shows a prior art hand-held processing unit;

Reference symbols are used in the drawings to indicate certain components, aspects or features shown therein, with reference symbols common to more than one drawing indicating like components, aspects or features shown therein.

DETAILED DESCRIPTION

One aspect of the present invention is a method and device for decompressing data, including, but not limited to multimedia data such as video data, for playback on electronic devices. More specifically, embodiments of the inventive method and the device storing a program to implement the method can run, in real-time, on electronic devices having limited resources, such as one or more of: a limited amount of memory; computing limited to slow processing speeds; lack of high-precision arithmetic functions such as floating point processing; and slow transfer times for providing compressed data to the processor. One or more of these limitations are present in embedded devices. Such embedded devices, include, but are not limited: to cell phones, personal digital assistants, and portable game machines. Aspects of the present invention are well-suited for replaying video data on embedded devices, such as portable game machines. While the embodiments presented herein describe the invention in terms of decompressing data on a game machine, the invention is not limited to these embodiments, as will become apparent to those in the art upon consideration of the following description.

Figure 3A:
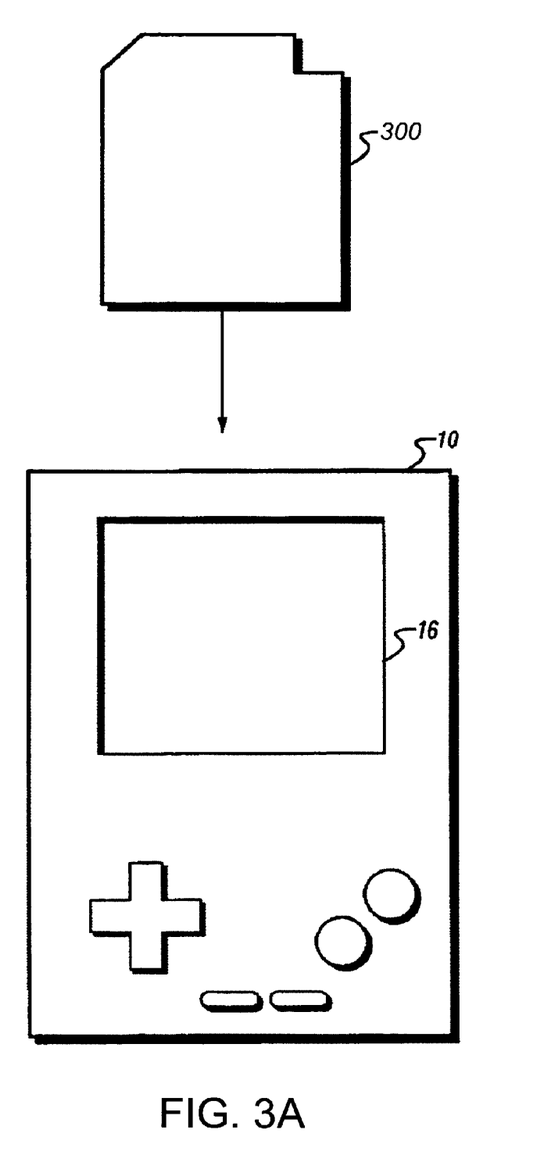
Figure 3B:
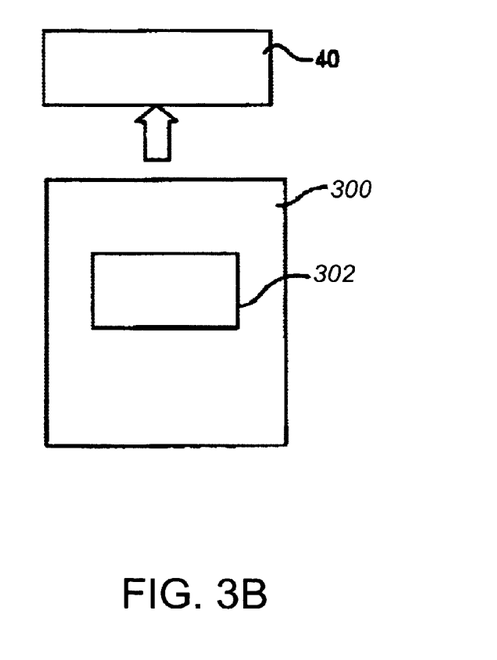
FIG. 3B shows a block diagram of a game cartridge that, for example, includes a program embodiment of the present invention.

Embodiments of the present invention include a method and a device for rapidly decompressing video data on embedded devices while minimizing the amount of memory required. One embodiment of the present invention is a carrier medium shown in FIG. 3A as a game cartridge 300 that is adapted for insertion into a prior art game machine 10 and that carries, e.g., in the memory of the cartridge instructions for implementing a method of decompression as described herein. FIG. 3B shows the game cartridge 300 having a memory 302 that includes programs for operating game machine 10 and data files containing video and sound data for display and listening on the game machine, where the programs and data files are provided in accordance with the methods, data structure, and/or programs of embodiments of the present invention. Thus, game cartridge 300 mates with connector 40, as shown in FIG. 3B, which is connected to CPU 25 for controlling game machine 10.

One compression embodiment of the present invention uses vector quantization applied to image sequences, a statistical compressor and several other methods, described subsequently, to improve the quality of the images and reduce the final stream size. Another embodiment includes the playback of compressed video data on embedded devices. The computational resources of the compression portion are secondary to the decompression on a target device, such as an embedded device. Therefore, it is assumed that computational limitations are important for playback, and less of an issue for the compressing of video data.

Figure 4:
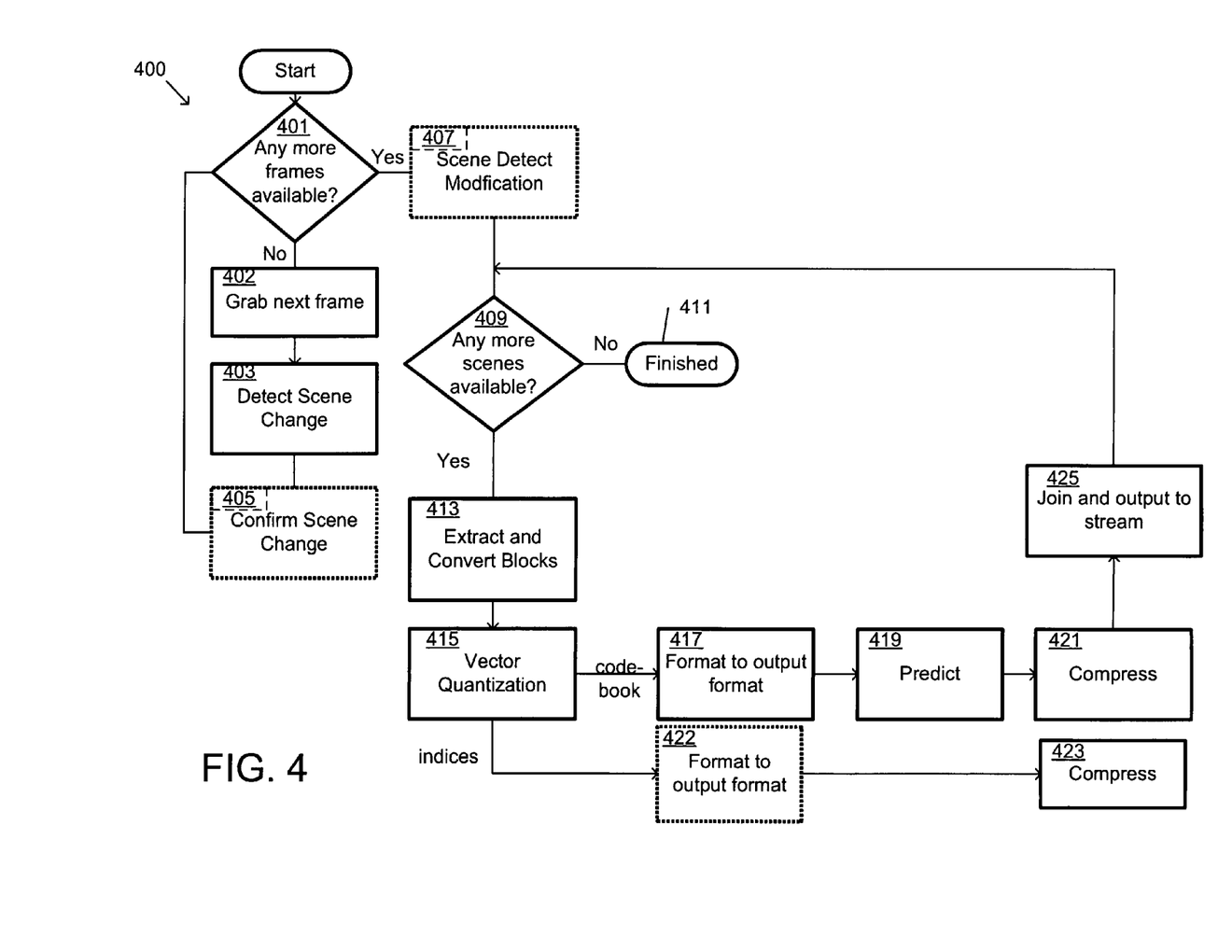
FIG. 4 shows a flowchart of a first embodiment of a video compression method that includes one or more aspects of the present invention.
Figure 5:
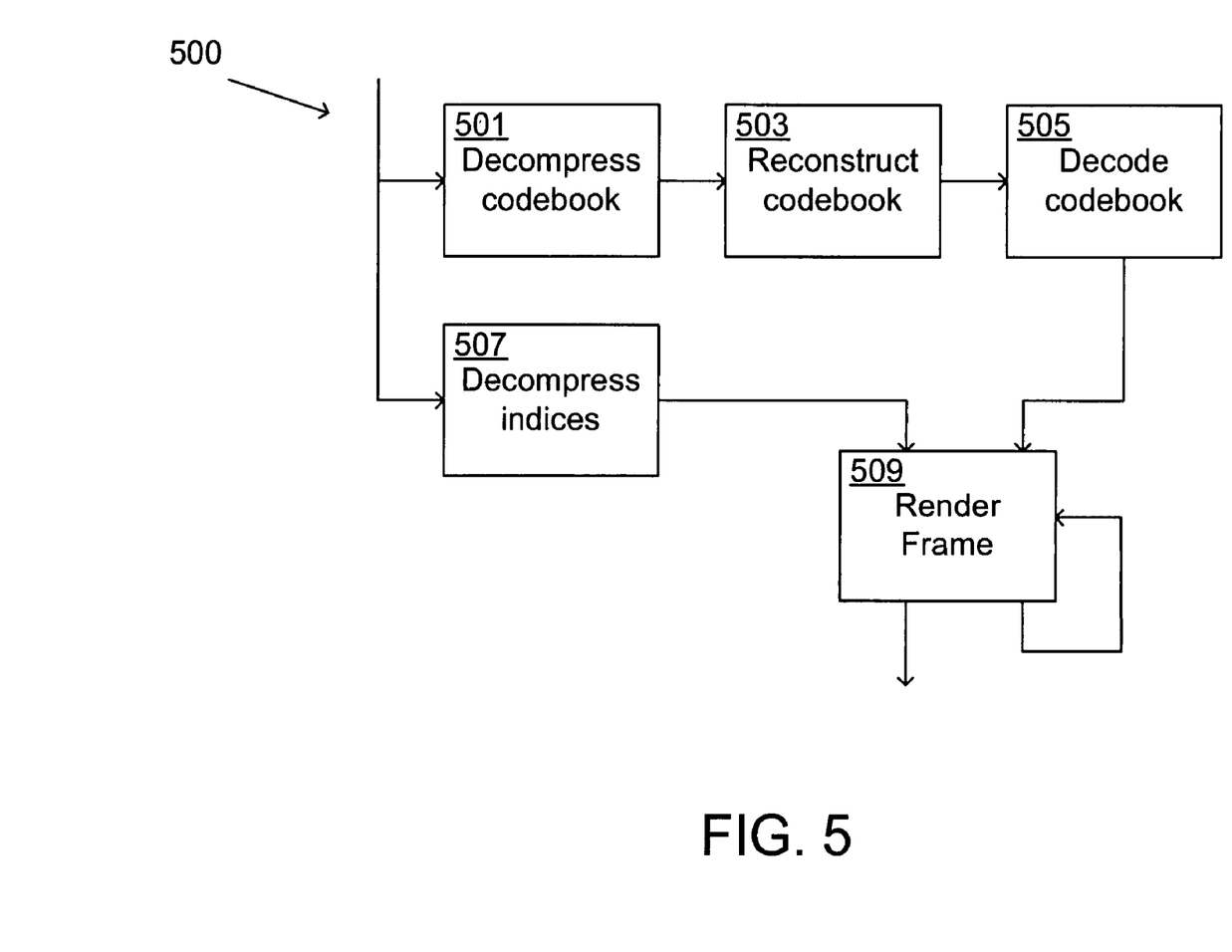
FIG. 5 shows a flowchart of a first embodiment of a video decompression method that includes one or more aspects of the present invention and FIG. 6 shows a flowchart of a second embodiment of a video decompression method that includes one or more aspects of the present invention.

Embodiments of compression and decompression of video data are presented in FIGS. 4 and 5, respectively. FIG. 4 shows a flowchart 400 for a first embodiment of a compression method and FIG. 5 shows a first flowchart 500 for a first embodiment of a decompression method. Optional blocks of a flowchart are indicated as dash-lined boxes. The methods illustrated by flowcharts 400 and 500 are well suited to the compression and decompression of digital video data representations, and specific examples, which are not meant to limit the scope of the present invention, will be presented for the compression, storage, and decompression of video data.

Compressed video data generated, for example, by the method illustrated by flowchart 400 is stored on game cartridge 300, and is preferably executed on computers used in the development of a game. The compressed video data generated by the method of flowchart 400 is then provided to game cartridge 300. The method illustrated by flowchart 500 is one embodiment of a method included as instructions in game cartridge 300 to allow game machine 10 to read and decompress the compressed video data stored on the game cartridge that was previously generated by the method of flowchart 400. As a result of the data processing by CPU 25, video data is provided to LCD 16.

Compression of video data is illustrated in FIG. 4, where it is received in the form of source image files, including but not limited to, BMP or PNG files, or source movie files, including but not limited to AVI files or MPEG files, and analyzed frame-by-frame to determine when scene changes occur. The method of the present invention performs VQ on identified groups of sequential frames (scenes) where there is little frame-to-frame difference. The frames within a scene tend to be highly correlated and thus a single set of vectors provides a good basis for quantizing all of the frames of a scene, and quantizing a movie one scene at a time.

The method described in flowchart 400 includes determining scene changes, vector quantizing all of the frames between two sequential scene changes to provide indices and a corresponding codebook to display the scene, applying a predictor to the codebook; and losslessly compressing the predictor applied codebook and indices.

As shown in flowchart 400, in one embodiment, a check is first performed to see if there are more frames available for processing (Block 401). If no more frames are available, the next frame is grabbed (Block 402), and scene changes are detected (Block 403). Within a scene there is little change from frame to frame, allowing for a large amount of compression of video data. Scene changes are detected by analyzing video frames in pairs for the entire video sequence as the current and previous frame.

Block 403 computes the number of pixels N of the frame that have changed between the pairs, and compares N against a first threshold $T_1$ and a second threshold $T_2$. The threshold $T_1$ is compared between pixels of the pair of frames. If the difference at a pixel is greater than $T_1$, the pixel is assumed to have changed. Threshold $T_1$ is preferably slightly greater than the pixel noise level, but is high enough to indicate no frame-to-frame change without providing any false no-change indications.

Once the entire image is processed, the number of pixels having changed is determined, and a percentage $P_C$ of changing pixels is compared against the threshold $T_2$. If $P_C > T_2$, then the frame is assumed to mark the beginning of a new scene.

The thresholds $T_1$ and $T_2$ depend on the content and video quality. In general static video sequences have a lower $T_2$ and fast moving action sequences have a higher $T_2$. It has been found that for a full frame video sequence, values of $T_1=10$ and $T_2=80$ are acceptable for determining scene changes. Letter-boxed images could require a lower value of $T_2$, while if the content is very noisy, a higher $T_1$ may be preferable.

If Block 403 indicates that the pair of frames does not belong to the same scene, then an optional Block 405 provides a check that the frames do indeed not belong to the same scene. The optional Block 405 is an override, as might be needed for specific cases where Block 403 gives a false positive scene change. The block 407 is a manual operation carried on by an operator once all the scenes are detected. This step simply provides for better compressed data, but is not necessary.

Examples of cases for such an override as in block 405 include, but are not limited to post-processing effects such as fast fades, where nearly 100% of the pixels change value. Fade detection can be applied by checking the overall intensity change for each group of short scenes—which most of the time are false detections. Other appropriate cases that might appear are fast moving sequences, which may be detected by a more complex technique, such as block motion detection. Block motion detection is a prior art technique used in motion compensation in common video compression methods such as the MPEG family, usually to reduce the data representing a sequence of images. See, for example, http://www.cmlab.csie.ntu.edu.tw/cml/dsp/training/coding/motion/me1.html. Because of computational complexity of block motion detection and compensation, in one embodiment, block motion detection is only used to detect problematic scenes, and not for motion compensation to compress the data.

Following Block 403 or optional Block 405, when it is included in the method, the method returns to Block 401.

If Block 401 indicates that there are more frames available, then an optional Block 405 confirms whether or not the pairs of frames are a good match, and whether or not the frames belong to the same scene. A basic luminance based block searching is run on the current image, with the previous image as a reference. Block sizes of 8×8 are used with a variable search radius. The overall distortion after the search is compared against a threshold $T_3$ that indicates if the scene can be discarded or kept. Usually if the search radius is large enough, important camera movements can be selected as part of the previous scene, instead of creating a new scene.

Next, it is determined if more scenes are available (Block 409). If not, the processing is complete (Block 411). If there are more scenes available, then all of the frames within the scene are processed (Block 413). Specifically, all frames within the source file or files that fall within the current scene are converted, if necessary, to a color space that facilitates processing, for example a color spacing having a luminance component, such as the YUV color space or YUV-like color spaces, as described in U.S. Provisional Patent Application No. 60/562,960, titled "APPARATUS AND METHOD FOR REPRESENTING VISUAL INFORMATION FOR EMBEDDED HANDHELD DEVICES," filed on Apr. 16, 2004 and incorporated herein by reference. Since luminance tends to be a dominant component in images, color bleeding is reduced in the quantization process and the image quality is significantly improved compared to the prior art use of RGB color space.

Next, block 415 vector quantizes each frame in the scene. A set of linear vectors is generated for each non-overlapping image block of predetermined size. In one embodiment, images of sizes that are not multiples of the block size are cropped to the smallest multiple. In one embodiment, a block size of four pixels by four pixels is used. The set of vectors created this way is a source set, which is provided to a vector quantizer. The use of VQ is well known in the field. See, for example, *Vector Quantization and Signal Compression* by Allen Gersho and Robert M. Gray, Kluwer International Series in Engineering and Computer Science, 159, Kluwer Academic Publishers, January 1992. After the vectors are determined for the current scene, a quantizer is used to quantize each frame using the same vector set. The preferred quantization process is a clustering technique, namely the generalized Lloyd method, e.g. as described in the paper by Y. Linde, A. Buzo, and R. Gray titled "An Method for Vector Quantizer Design," *IEEE Trans. on Comm.*, Vol. 28, pp. 84-95, January 1980.

Next, the quantized vector set is extracted and converted to output format (Block 417). This includes, but is not limited to formatting the color space to a predetermined number of bits, according to the output color space (Block 417), if required by the user. Thus, while in one embodiment, quantization is performed in a luminance coordinate containing color space such as the YUV color space, it is not necessary that the exported codebook is also stored in the same format. Thus for example, the codebook can be converted back to RGB space or another color space by the known transform between the vector color space and RGB or the other color space. The conversion of color space is left to the discretion of the user.

Thus, a codebook is determined for use for all of the frames in each scene. For these frames there is the codebook for the scene and the indices for each frame in the scene.

Next, a predictor is applied on the formatted codebook data (Block 419), specifically to predict color values for each codebook. In one embodiment of the invention, each codebook includes three buffers, one for each Y U and V buffer, and represents one or more pixels. Thus for example the codebook may include buffers for Y, U and V values for each group of 4 pixels. The buffer values are either one byte unsigned (for Y) or one byte signed (U or V). The predictor is an order-n predictor. Preferably, the predictor is an order-1 linear predictor that operates on each buffer. If X represents one of the Y,U,V buffers, n is the current prediction position in the buffer and n−1 is the previous position in the buffer, then an order-1 linear predictor generates a predicted X value, denoted here as P(n), according to $P(n)=X(n)-X(n-1)$.

The indices are optionally formatted to output format (Block 422). In this optional Block, the best matching vector for each input vector in the codebook is selected and its ID outputted as an index.

The formatted codebook data and VQ indices are each compressed (Blocks 421 and 423, respectively). Compression is performed using a lossless statistical compression method. In one embodiment of the present invention, compression is performed by applying two or more consecutive lossless compression methods to the data, for example, by applying a method that searches for and replaces repeating data sequences in a more compact manner, followed by an entropy encoding method that categorizes data according to their frequency and replaces more frequently occurring strings with smaller strings. An example of such a technique is found in the DEFLATE compression method. (RFC 1951, *DEFLATE Compressed Data Format Specification version 1.3*, http://www.ietf.org/rfc/rfc1951.txt). DEFLATE uses Lempel-Ziv 1977 (LZ77) compression to reduce the number of bits required to store repeating strings, and then further compresses the data using, as an entropy coding method, either fixed or dynamic Huffman coding.

Final formatting occurs with the compressed codebook and indices, and the scene headers, which can include but is not limited to the block size, the compression type and any other information related to the quantizer such as the codebook size, the size for each index, and any other side information arranged for inclusion in the output stream (Block 425).

Decompressing the Video Stream

One embodiment of a decoding method to display video data coded according to the method shown in flowchart 400 is illustrated by flowchart 500. Specifically, flowchart 500 illustrates one embodiment of a video decoding method where the compressed video data is compressed using VQ, with the quantized vectors provided for a scene (a sequence of frames) that is highly correlated. The compressed data is reconstructed using inverse VQ.

Each frame is reconstructed using inverse VQ by a provided codebook of vectors of color components and indices specifying the distribution of codebook vectors in the frame. When a new codebook is received for display, indicating a new scene as in the method of flowchart 400, the codebook is decompressed (Block 501), for example using DEFLATE, the codebook is reconstructed (Block 503), for example by a prediction algorithm, and the codebook is decoded (Block 505), for example as described with reference to Block 417, and provided as vectors for rendering frames based on the indices and codebook (Block 509). When the indices for each frame are received for display, they are decompressed (Block 507) and provided for rendering frames (Block 509).

The smooth execution of flowchart 500 depends on the ability of the embedded device, for example the processor of game machine 10, to provide codebooks and indices derived from the compressed data for each frame at the proper framing rate. Thus, for example, for sequential scene frames, no codebook manipulation is required, since each frame in each scene is quantized with the same codebook, and game machine 10 need only be able to decompress the indices (Block 507) and render the frame (Block 509) in a time equal to or less than the frame rate. In addition, when there is a scene change, game machine 10 must also be able to also provide the new codebook to Block 509 before the first frame of the new scene can be displayed.

Figure 6:
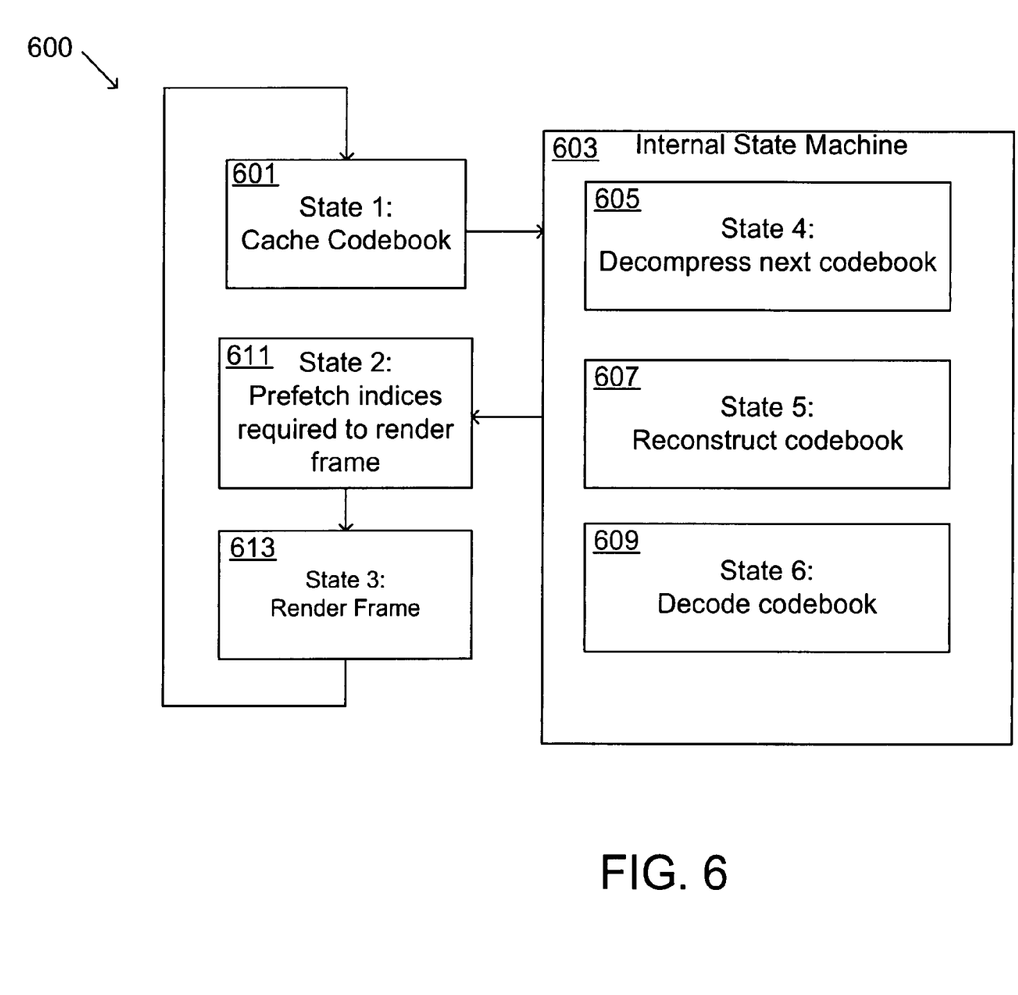

FIG. 6 shows a flowchart 600 of a second embodiment video decompression method. The method of flowchart 600 provides a method for better using CPU time to ensure that the codebooks are provided for rendering frames without having to wait for codebook manipulation by pre-processing the codebooks using excess computing capacity. More specifically, using the method shown in flowchart 600, it is expected that video decompression will run smoothly, without any tearing or frame dropping, by controlling the processing of codebook, indices and frame rendering.

Excess computing capacity is present as follows. Assume that for a video stream the frame rate F, the average execution time per frame must be limited to less than 1/F ms. Also assume that the time required to render a frame using a new set of indices and a new codebook is no more than $T_{max}$ ms, and that the time required to render a frame using a new set of indices and a previously processed codebook is $T_{min}$ ms. If $T_{max}<1/F$, then enough computing power is present to render frames smoothly, even if the scene were to change with each frame. If $T_{max}>1/F>T_{min}$ then there is enough time to render frames within a scene, but not enough time to render frames with a scene change. However, for each frame having no scene change there is $1/F-T_{min}$ of potentially unused computing capacity. Since scene changes are infrequent, there is the potential of having a large amount of unused computing capacity between scene changes. The second embodiment video decompression method shown in FIG. 6 uses this potentially unused computing capacity to process a future codebook before it is needed by splitting the processing of codebooks over time and caching any data required for future processing, rather than to process it as is needed.

Specifically, the second embodiment video decompression method illustrated in FIG. 6 divides the computing resource between caching codebooks (State 1: Block 601), prefetching indices for a scene (State 2: Block 611), and rendering frames (State 3: Block 613). In addition the caching is controlled by an internal state machine (Block 603) that decompresses the next codebook (State 4: Block 605), reconstructs the codebook (State 5: Block 607), and decodes the codebook (State 6: Block 609). The state blocks control the actions of each block so that there is enough time to render a frame and to perform other actions.

Consider, for example, that the codebook has been processed by internal state machine (Block 603) and the indices are about to be fetched to render the first frame of the scene. Since there is more than enough time to fetch one frame of indices and render the frame, Block 611 prefetches as many frame indices as it has time to fetch. If not all of the indices of the scene are perfected, the prefetching can be continued after the frame has been rendered. The next frame is then rendered (Block 613). If all of the indices for the scene have been prefetched, the Block 601 can direct internal state machine (Block 603) to process as much of the next codebook as time allows. As with the indices, if the codebook cannot be entirely processed, then further caching is left until after the next frame is rendered.

If more than one scene's stream can be contained in internal memory, then future codebooks can be easily assessed and cached. Specifically, the caching mechanism of State 1 has a different pointer in the video/audio data stream than the caching mechanism of States 2 and 3. In the stream, each scene is represented by a header, the compressed codebook and the compressed indices. The header contains the size of each of the compressed data, so the data can easily be skipped and the next codebook can be cached. As the stream is located in ROM, the access time is almost the same as the internal memory, so the process can access any location at any time.

At some time, all of the indices for the current frame are prefetched and the next codebook has been cached. At this point, flowchart 600 skips all Blocks except Block 613, as the prefetched indices are rendered, one frame at a time. When the current scene is finished rendering, the next codebook has been cached, and the process repeats.

Alternatively, if there is enough memory available the caching and prefetching can continue 2 or more scenes in advance.

Thus, embodiments of methods of decompressing have been presented.

One embodiment of each of the methods described herein is in the form of a computer program that executes on a processing system, e.g., a one or more processors that are part of an embedded device that includes an image display system. Thus, as will be appreciated by those skilled in the art, embodiments of the present invention may be embodied as a method, an apparatus such as a special purpose apparatus, an apparatus such as a data processing system, or a carrier medium, e.g., a computer program product. The carrier medium carries one or more computer readable code segments for controlling a processing system to implement a method. Accordingly, aspects of the present invention may take the form of a method, an entirely hardware embodiment, an entirely software embodiment or an embodiment combining software and hardware aspects. Furthermore, the present invention may take the form of carrier medium (e.g., a computer program product on a computer-readable storage medium) carrying computer-readable program code segments embodied in the medium. Any suitable computer readable medium may be used including a magnetic storage device such as a diskette or a hard disk, a game machine cartridge, or an optical storage device such as a CD-ROM.

It will be understood that the steps of methods discussed are performed in one embodiment by an appropriate processor (or processors) of a processing (i.e., computer) system executing instructions (code segments) stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

It should further be appreciated that although the coding of the video codec has not be discussed in detail, the invention is not limited to a specific coding method. Thus, for example, alternate methods may be used to reduce the overhead of VQ decoding, and the invention is not limited to such contexts and may be utilized in various other applications and systems, for example in a system that other compressed media streams. Furthermore, the invention is not limited to any one type of network architecture and method of encapsulation, and thus may be utilized in conjunction with one or a combination of other network architectures/protocols.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. Thus, the scope of the expression a device A coupled to a device B should not be limited to devices or systems wherein an output of device A is directly connected to an input of device B. It means that there exists a path between an output of A and an input of B which may be a path including other devices or means.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

I claim:

1. A method of operating a processor for decompressing compressed data, wherein said compressed data is representative of a movie having frames forming scenes and having scene changes between said scenes, said method comprising:
   fetching compressed data corresponding to the frames of a scene;
   performing an inverse entropy decompression on said fetched compressed data to produce indices and codebook for the frames of a scene;
   reconstructing said codebook;
   decoding said codebook; and
   applying said indices and decoded codebook to render frames of said scene,
   wherein said codebook is determined by processing frames between two sequential scene changes, and
   wherein said scene changes are determined by a method that includes determining a number of pixels that have changed scene-to-scene, and determining whether the number of pixels that have changed exceed a threshold,
   wherein said decompressed data includes a first sequence of indices and a corresponding first codebook for rendering frames of a first scene, followed by a second sequence of indices and a corresponding second codebook for rendering frames of a second scene following said first scene, said method comprising:
   allocating processing between the rendering of sequential frames, wherein said allocating includes:
      allocating of processing time for prefetching indices for use with the first codebook, and then
      allocating of processing time for prefetching said second codebook; and caching prefetched indices and codebooks.

2. The method of claim 1, wherein said compressed data is compressed using a method comprising:

determining scene changes, each scene change determined by a method that includes determining a number of pixels that have changed frame-to-frame, and determining whether the number of pixels that have changed exceed a threshold;

determining a codebook by processing frames between two sequential scene changes;

vector quantizing the frames between two sequential scene changes using said codebook to provide indices to display said scene;

applying a predictor to the codebook; and losslessly compressing said predictor applied codebook and indices.

3. The method of claim 1, wherein said performing an inverse entropy decompression includes applying the DEFLATE decompression method.

4. The method of claim 1, wherein said decompressed data further includes a third sequence of indices having the same corresponding third codebook for rendering frames of a third scene following said second scene, and where, if said second codebook is prefetched while said first codebook is being used to display content, said allocating further includes:

allocating processor time for prefetching said third codebook.

5. A computer-readable hardware storage medium configured with one or more computer readable code segments to instruct a processor to implement a method for decompressing data representative of a movie having frames forming scenes and having scene changes between said scenes, said method comprising:

fetching compressed data corresponding to the frames of a scene;

performing an inverse entropy decompression on said fetched compressed data to produce indices and codebook for the frames of a scene;

reconstructing said codebook;

decoding said codebook; and applying said indices and decoded codebook to render frames of said scene, wherein said codebook is determined by processing frames between two sequential scene changes, and wherein said scene changes are determined by a method that includes determining a number of pixels that have changed scene-to-scene, and determining whether the number of pixels that have changed exceed a threshold, wherein said decompressed data includes a first sequence of indices and a corresponding first codebook for rendering frames of a first scene, followed by a second sequence of indices and a corresponding second codebook for rendering frames of a second scene following said first scene, said method comprising:

allocating processing between the rendering of sequential frames, wherein said allocating includes allocating of processing time for prefetching indices for use with the first codebook, and then allocating of processing time for prefetching said second codebook; and caching prefetched indices and codebooks.

6. The computer-readable hardware storage medium of claim 5, wherein said movie is compressed using a compression method comprising:

determining scene changes, each scene change determined by a method that includes determining a number of pixels that have changed frame-to-frame, and determining whether the number of pixels that have changed exceed a threshold;

determining a codebook by processing frames between two sequential scene changes;

vector quantizing the frames between two sequential scene changes using said codebook to provide indices to display said scene;

applying a predictor to the codebook; and losslessly compressing said predictor applied codebook and indices.

7. The computer-readable hardware storage medium of claim 5, wherein said performing an inverse entropy decompression includes applying the DEFLATE decompression method.

8. The computer-readable hardware storage medium of claim 5, wherein the carrier medium is a game cartridge.

9. The computer-readable hardware storage medium of claim 5, wherein said decompressed data further includes a third sequence of indices having the same corresponding third codebook for rendering frames of a third scene following said second scene, and where, if said second codebook is prefetched while said first codebook is being used to display content, said allocating further includes:

allocating processor time for prefetching said third codebook.

10. A method of operating a processor for decompressing data, said data representative of a movie having frames forming scenes and having scene changes between said scenes, wherein said decompressed data includes a first sequence of indices and a corresponding first codebook for rendering frames of a first scene, followed by a second sequence of indices and a corresponding second codebook for rendering frames of a second scene following said first scene, said method comprising:

allocating processing between the rendering of sequential frames, wherein said allocating includes:

allocating of processing time for prefetching indices for use with the first codebook, and then allocating of processing time for prefetching said second codebook; and caching prefetched indices and codebooks, where wherein said first and second codebook are determined by processing frames between sequential scene changes, and where wherein said scene changes are determined by a method that includes determining a number of pixels that have changed frame-to-frame, and determining whether the number of pixels that have changed exceed a threshold.

11. The method of claim 10, wherein said prefetching indices for use with the first codebook includes:

one or more of fetching compressed data including at least compressed indices of said first scene, or performing an inverse entropy decompression on previously fetched compressed data to produce at least a portion of said first sequence of indices; and caching said at least a portion of said first sequence of indices.

12. The method of claim 10, wherein said prefetching said second codebook includes:

one or more of fetching compressed data including compressed codebook of said second scene, performing an inverse entropy decompression on a previously fetched compressed data to produce at least a portion of said second codebook, reconstructing at least a portion of said second codebook, or decoding at least a portion of said second codebook; and caching said at least a portion of said second codebook.

13. The method of claim 10, wherein said decompressed data further includes a third sequence of indices having the same corresponding third codebook for rendering frames of a third scene following said second scene, and where, if said second codebook is prefetched while said first codebook is being used to display content, said allocating further includes:

allocating processor time for prefetching said third codebook.

14. A computer-readable hardware storage medium configured with one or more computer readable code segments to instruct a processor to implement a method for decompressing data representative of a movie having frames forming scenes and having scene changes between said scenes, wherein said decompressed data includes a first sequence of indices and a corresponding first codebook for rendering frames of a first scene, followed by a second sequence of indices and a corresponding second codebook for rendering frames of a second scene following said first scene, said method comprising:

allocating processing between the rendering of sequential frames, wherein said allocating includes:
  allocating of processing time for prefetching indices for use with the first codebook, and then
  allocating of processing time for prefetching said second codebook; and
caching prefetched indices and codebooks,
wherein said first and second codebooks are determined by processing frames between sequential scene changes, and
wherein said scene changes are determined by a method that includes determining a number of pixels that have changed frame-to-frame, and determining whether the number of pixels that have changed exceed a threshold.

15. The computer-readable hardware storage medium of claim 14, wherein said prefetching indices for use with the first codebook includes:

one or more of fetching compressed data including at least compressed indices of said first scene, or performing an inverse entropy decompression on previously fetched compressed data to produce at least a portion of said first sequence of indices; and caching said at least a portion of said first sequence of indices.

16. The computer-readable hardware storage medium of claim 14, wherein said prefetching said second codebook includes:

one or more of fetching compressed data including compressed codebook of said second scene, performing an inverse entropy decompression on a previously fetched compressed data to produce at least a portion of said second codebook, reconstructing at least a portion of said second codebook, or decoding at least a portion of said second codebook; and caching said at least a portion of said second codebook.

17. The computer-readable hardware storage medium of claim 14, wherein said decompressed data further includes a third sequence of indices having the same corresponding third codebook for rendering frames of a third scene following said second scene, and where, if said second codebook is prefetched while said first codebook is being used to display content, said allocating further includes:

allocating processor time for prefetching said third codebook.

\* \* \* \* \*

UNITED STATES PATENT AND TRADEMARK OFFICE
CERTIFICATE OF CORRECTION

PATENT NO. : 7,751,483 B1  Page 1 of 1
APPLICATION NO. : 11/103898
DATED : July 6, 2010
INVENTOR(S) : Ganea

It is certified that error appears in the above-identified patent and that said Letters Patent is hereby corrected as shown below:

In Column 14, line 44, before "wherein" kindly delete the word "where".

In Column 14, line 47, before "wherein" kindly delete the word "where".

Signed and Sealed this

Fifth Day of October, 2010

David J. Kappos
*Director of the United States Patent and Trademark Office*